(12) United States Patent
Champlin

(10) Patent No.: US 6,621,272 B2
(45) Date of Patent: Sep. 16, 2003

(54) PROGRAMMABLE CURRENT EXCITER FOR MEASURING AC IMMITTANCE OF CELLS AND BATTERIES

(76) Inventor: Keith S. Champlin, 5437 Elliot Ave. S., Minneapolis, MN (US) 55417

(*) Notice: Subject to any disclaimer, the term of this patent is extended or adjusted under 35 U.S.C. 154(b) by 0 days.

(21) Appl. No.: 10/270,777

(22) Filed: Oct. 15, 2002

(65) Prior Publication Data

US 2003/0071627 A1 Apr. 17, 2003

Related U.S. Application Data

(63) Continuation of application No. 09/977,049, filed on Oct. 12, 2001, now Pat. No. 6,466,026.

(51) Int. Cl.[7] .................................. G01N 27/416
(52) U.S. Cl. ............................................. 324/426
(58) Field of Search ................ 324/426, 429, 324/460, 433; 320/132, 134, 133, 136, 139, 141, 130

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| FR | 2 749 397 | 12/1997 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 03274479 | 12/1991 |
| JP | 03282276 | 12/1991 |
| JP | 04131779 | 5/1992 |
| JP | 04372536 | 12/1992 |

(List continued on next page.)

OTHER PUBLICATIONS

"Electrochemical Impedance Spectroscopy in Battery Development and Testing", *Batteries International*, Apr. 1997, pp. 59 and 62–63.

(List continued on next page.)

*Primary Examiner*—Edward H. Tso
(74) *Attorney, Agent, or Firm*—Westman, Champlin & Kelly, P.A.

(57) ABSTRACT

An exciter of periodic square-wave current for measurement of complex ac impedance or admittance is described. A microcontroller/processor outputs two digital words that define upper and lower current levels. These words are latched and converted to analog voltages by D/A converter circuitry. A timing signal at the measurement frequency, also outputted by the microprocessor/controller, controls a multiplexer arranged to select either analog voltage. The multiplexer output thus toggles between the two programmed analog voltages at the measurement frequency.

By virtue of negative feedback, the toggled multiplexer output voltage equals the voltage developed across a resistance in series with the cell/battery. Two complementary transistors and a dc voltage source are arranged such that a positive multiplexer output directs a programmed current through this resistance in the "discharge" direction, and a negative multiplexer output directs a programmed current through it in the "charge" direction. Accordingly, the current through the cell/battery is a symmetrical square wave having frequency, amplitude, average value, and average flow direction completely under program control.

35 Claims, 3 Drawing Sheets

U.S. PATENT DOCUMENTS

| | | | |
|---|---|---|---|
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,385,269 A * | 5/1983 | Aspinwall et al. | |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/62 |
| 4,520,353 A | 5/1985 | McAuliffe | 340/636 |
| 4,564,798 A | 1/1986 | Young | 320/6 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,686,442 A * | 8/1987 | Radomski | |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,888,716 A | 12/1989 | Ueno | 364/550 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |

| Patent | Date | Inventor | Class |
|---|---|---|---|
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/48 |
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/43.4 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,222,369 B1 | 4/2001 | Champlin | 324/430 |
| 6,225,808 B1 | 5/2001 | Varghese et al. | 324/426 |
| 6,236,332 B1 | 5/2001 | Conkright et al. | 340/825.06 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertess | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,359,441 B1 | 3/2002 | Bertness | 324/426 |
| 6,363,303 B1 | 3/2002 | Bertness | 701/29 |
| 6,384,608 B1 | 5/2002 | Namaky | 324/425 |
| 6,388,448 B1 | 5/2002 | Cervas | 324/426 |
| 6,392,414 B2 | 5/2002 | Bertness | 324/429 |
| 6,411,098 B1 | 6/2002 | Laletin | 324/436 |
| 6,417,669 B1 | 7/2002 | Champlin | 324/426 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 * | 10/2002 | Champlin | |
| 6,495,990 B2 | 12/2002 | Champlin | 320/132 |

FOREIGN PATENT DOCUMENTS

| | | |
|---|---|---|
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/58270 | 12/1998 |
| WO | WO 99/23738 | 5/1999 |
| WO | WO 00/67359 | 11/2000 |
| WO | WO 01/51947 | 7/2001 |

OTHER PUBLICATIONS

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semiconductor Corporation, "LMF90–$4^{th}$–Order Elliptic Notch Filter", 12/94, RRD–B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e–Catalog*, downloaded from http://www.pcbcafe.com, undated.

"Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://www.powederdesigners.com/InforWeb.design_center/articles/DC–DC/converter.shtm, undated.

"Notification of Transmittal of The International Search Report or the Declaration", PCT/US02/29461. no date.

"Notification of Transmittal of International Search Report or the Declaration" for PCT/US02/29461. no date.

* cited by examiner

PROGRAMMABLE CURRENT EXCITER FOR MEASURING AC IMMITTANCE OF CELLS AND BATTERIES

The present application is a Continuation of and claims priority of U.S. patent application Ser. No. 09/977,049, filed Oct. 12, 2001 now U.S. Pat. No. 6,466,026, the content of which is hereby incorporated by reference in its entirety.

BACKGROUND OF THE INVENTION

The present invention relates to electronically testing electrochemical cells and batteries. More specifically, it relates to method and apparatus for passing a programmably-determined periodic current through an electrochemical cell or battery to facilitate measurement of at least one component of its ac immittance (i.e., either ac impedance or ac admittance) at a specific frequency.

Electrochemical cells and batteries, such as primary cells/batteries, secondary (i.e., storage) cells/batteries, and fuel cells/batteries are important sources of electrical energy. As such, their complex impedance/admittance is of both theoretical and practical interest. Recent U.S. patents issued to Champlin disclose methods and apparatus for accurately measuring components of complex impedance (U.S. Pat. No. 6,002,238; U.S. Pat. No. 6,172,483) and complex admittance (U.S. Pat. No. 6,262,563) of cells/batteries at a specific frequency. A common feature of these inventions is that they all employ a periodic current—a current that need not be sinusoidal—to excite the cell/battery undergoing test.

Consider FIG. 1. This figure depicts immittance-measuring apparatus disclosed in the prior art U.S. Pat. Nos. 6,002,238, 6,172,483, and 6,262,563 and shows details of current excitation circuitry disclosed therein. Current exciter 5 comprises a series combination of load resistor 25 and controlled switch (i.e. transistor) 30 connected to cell/battery 10 through current-carrying contacts A and B. A symmetrical timing signal 70 outputted by microprocessor/controller 20 turns controlled switch 30 "on" and "off" at the measurement frequency f. Accordingly, a square-wave current −i(t) at frequency f flows through the cell/battery in the discharging direction as shown. (By convention, cell/battery current is assumed positive in the charging direction.) The peak to peak amplitude and average value of this generated square wave are $|V_B/R_L|$ amps and $-(V_B/2R_L)$ amps, respectively, where $V_B$ is the cell/battery voltage and $R_L$ is the load resistance. Current exciter 5 also outputs a signal voltage $R_L i(t)$ 35 for processing by the remaining measurement circuitry. The function and operation of all other elements depicted in FIG. 1 have been fully explained in the referenced Champlin patents and will not be repeated herein.

One problem with this prior art current exciter is that the excitation current is inevitably a discharging current. There is, however, ample theoretical basis for believing that immittance measured with zero net current, or even with a net charging current, is equally important. Furthermore, the amplitude of the generated square-wave in this prior art circuit is fixed at a value determined by the cell/battery voltage and the resistance of the load resistor. This fixed amplitude may not be large enough to develop sufficient ac voltage across low-impedance cells/batteries for accurate measurement. Or, it may be so large that high-impedance cells/batteries are driven into nonlinearity. All of these objections to the method disclosed in the prior art are surmounted by the inventions disclosed herein.

The programmable current exciter disclosed herein bears some resemblance to the "flying bridge" circuit disclosed in FIG. 5 of PCT Application WO 99/18448. However, a careful comparison of the two inventions reveals very significant differences in the objectives, implementation and results achieved.

SUMMARY OF THE INVENTION

The present invention comprises an exciter of periodic square-wave current for use in measuring one or more components of complex ac impedance or admittance of a cell or battery. A microcontroller/processor outputs two digital words that define upper and lower current levels. These words are latched and converted to analog voltages by D/A converter circuitry. A timing signal at the measurement frequency, also outputted by the microprocessor/controller, controls a multiplexer arranged to select either analog voltage. The multiplexer output thus toggles between the two programmed analog voltages at the measurement frequency.

By virtue of negative feedback, the toggled multiplexer output voltage equals the voltage developed across a resistance in series with the cell/battery. Two complementary transistors and a dc voltage source are arranged such that a positive multiplexer output directs a programmed current through this resistance in the "discharge" direction, and a negative multiplexer output directs a programmed current through it in the "charge" direction. Accordingly, the current through the cell/battery is a symmetrical square wave having frequency, amplitude, average value, and average flow direction completely under program control.

DETAILED DESCRIPTION OF THE PREFERRED EMBODIMENTS

Figure 1:
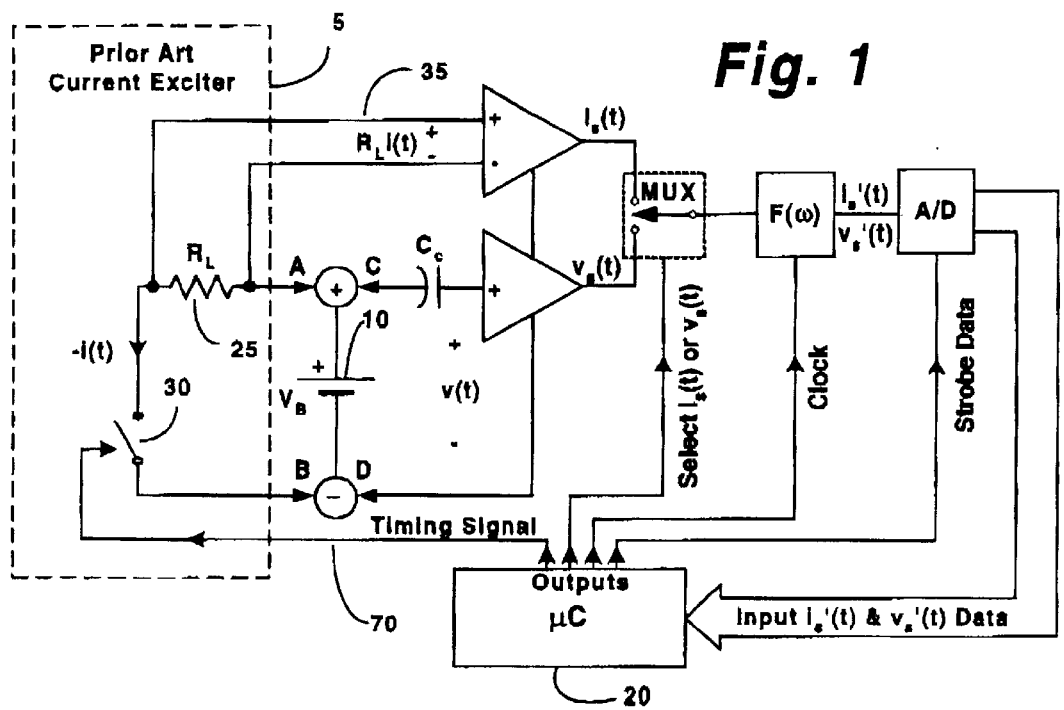
FIG. 1 depicts immittance-measuring apparatus disclosed in prior art U.S. Pat. Nos. 6,002,238, 6,172,483, and 6,262,563 and shows details of the current excitation circuitry disclosed therein.
Figure 2:
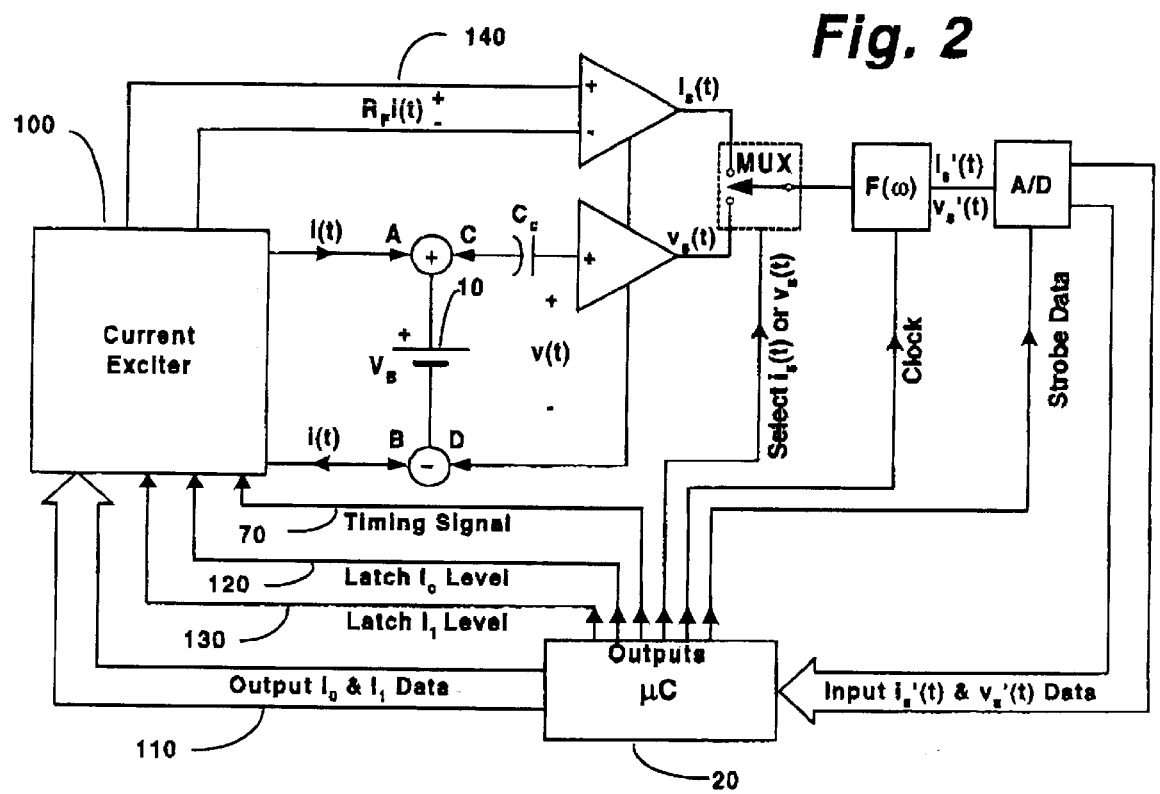
FIG. 2 depicts the apparatus of FIG. 1 with its prior art current excitation circuitry replaced by current exciter 100 in accordance with one aspect of the present invention.

Consider FIG. 2. This figure depicts the apparatus of FIG. 1 with its prior art current excitation circuitry replaced by current exciter 100 in accordance, with the present invention. In addition to communicating "Timing Signal" 70 to current exciter 100, microprocessor/controller 20 also communicates "$I_0$ & $I_1$ Data", 110, as well as the two commands "Latch $I_0$ Level", 120, and "Latch $I_1$ Level", 130. The quantities $I_0$ and $I_1$ denote two programmable levels of a square-wave excitation current. Current exciter 100 also outputs a signal voltage $R_F i(t)$ 140 for processing by the remaining measurement circuitry. All other elements depicted in FIG. 2 function and operate identically to those in the Champlin patents referenced above.

Figure 3:
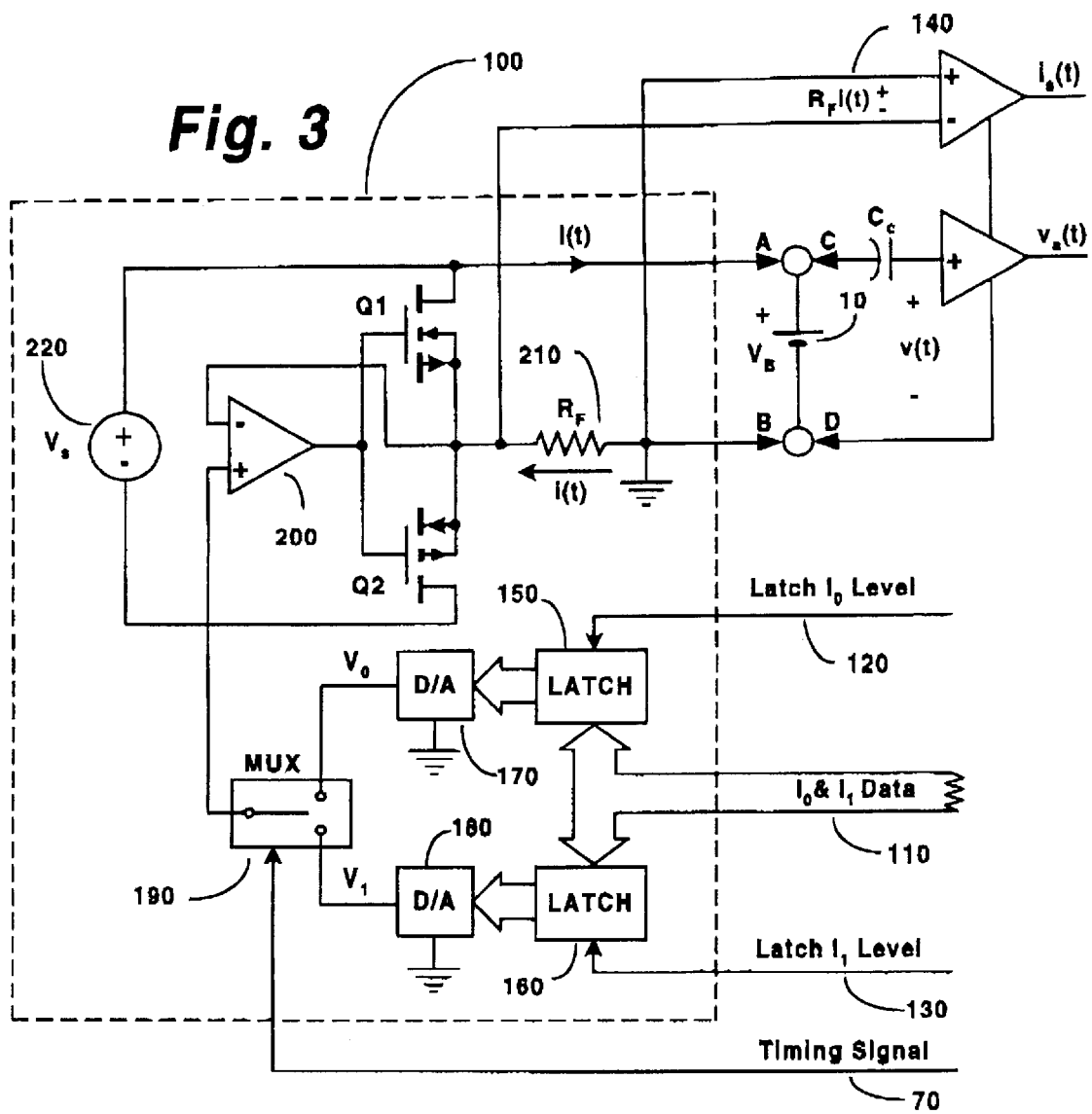
FIG. 3 is a schematic representation disclosing details of current exciter 100 of FIG. 2 in accordance with one aspect of the present invention.

FIG. 3 discloses details of current exciter 100 of FIG. 2 in accordance with one aspect of the present invention. Digital "$I_0$ & $I_1$ Data" signal 110 is presented to the inputs of both latch 150 and latch 160. Upon assertion of a "Latch $I_0$ Level" command 120 by microprocessor/controller 20, a number proportional to the value of $I_0$ is stored in latch 150. Similarly, upon assertion of a "Latch $I_1$ Level" command 130 by microprocessor/controller 20, a number proportional to the value of $I_1$ is stored in latch 150. The digital values stored in latches 150 and 160 are presented to the inputs of D/A converters 170 and 180, respectively. Accordingly, the analog voltages at the outputs of D/A converters 170 and 180 have values $V_0$ and $V_1$, respectively, corresponding to current levels $I_0$ and $I_1$, respectively. Multiplexer 190, controlled by symmetrical "Timing Signal" 70, accepts analog voltages $V_0$ and $V_1$ as inputs. Accordingly, the output of multiplexer 190 is a symmetrical square-wave that oscillates between voltage levels $V_0$ and $V_1$ at the measurement frequency f.

The output of multiplexer 190 connects to the noninverting input of operational amplifier 200, and the inverting input of operational amplifier 200 connects to the left side of feedback resistor 210. Negative feedback requires the voltages at the inverting and noninverting inputs of operational amplifier 200 to be equal. Accordingly, the voltage at the left side of resistor 210 emulates the voltage applied to the noninverting input of operational amplifier 200 by multiplexer 190. This equality of voltages is accomplished through power supplied to resistor 210 by cell/battery 10 (having dc voltage $V_B$), auxiliary dc supply 220 (having dc voltage $V_S > V_B$), and complementary power mosfets Q1 and Q2. The functioning of these four power elements leading to voltage equality can be readily explained with reference to FIGS. 4 and 5.

Figure 4:
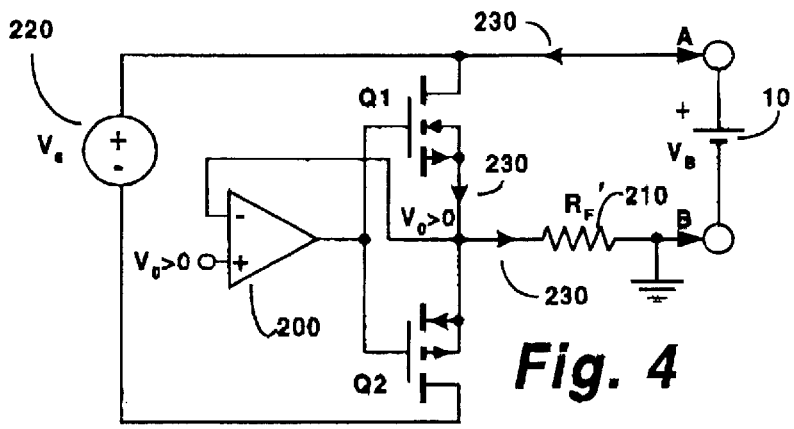
FIG. 4 is a schematic representation of a portion of the circuit of FIG. 3 showing the path of current flow under conditions of positive control voltage in accordance with one aspect of the present invention.

FIG. 4 depicts conditions that prevail when the dc voltage applied to the noninverting input of operational amplifier 200 is a positive value, $V^+ = V_0 > 0$. A discharging (negative) current $I_0 = -(V_0/R_F)$ 230 flows out of the positive terminal of cell/battery 10 via contact A, through n-channel mosfet transistor Q1, returning to cell/battery 10 via resistor 210 and contact B.

Figure 5:
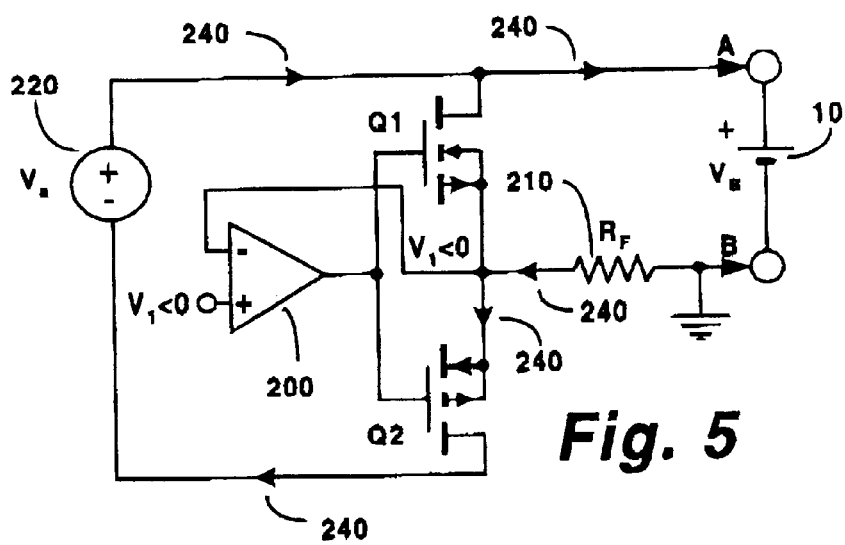
FIG. 5 is a schematic representation of a portion of the circuit of FIG. 3 showing the path of current flow under conditions of negative control voltage in accordance with one aspect of the present invention.

FIG. 5 depicts conditions that prevail when the dc voltage applied to the noninverting input of operational amplifier 200 is a negative value, $V^+ = V1 < 0$. A charging (positive) current $I_1 = -(V_1/R_F)$ 240 flows out of the negative terminal of cell/battery 10 via contact B, through resistor 210, through p-channel mosfet transistor Q2, through auxiliary dc supply 220, returning to the positive terminal of cell/battery 10 via contact A. Note that $V_S$ must be larger than $V_B$ in order for this charging current to be viable.

Figure 6:
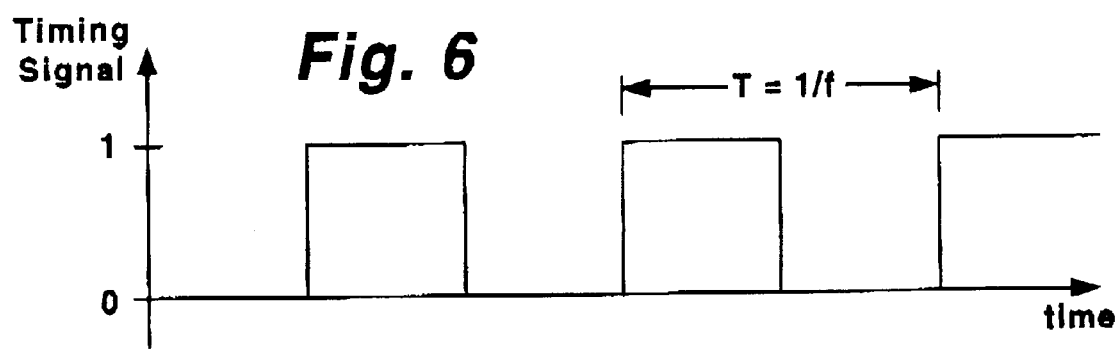
FIG. 6 is graph of the timing signal as a function of time in accordance with one aspect of the present invention.

FIG. 6 is graph of timing signal 70 as a function of time. One sees that timing signal 70 is a symmetrical square wave that oscillates between a logic "zero" and a logic "one" with period T=1/f, where f is the measurement frequency.

Figure 7:
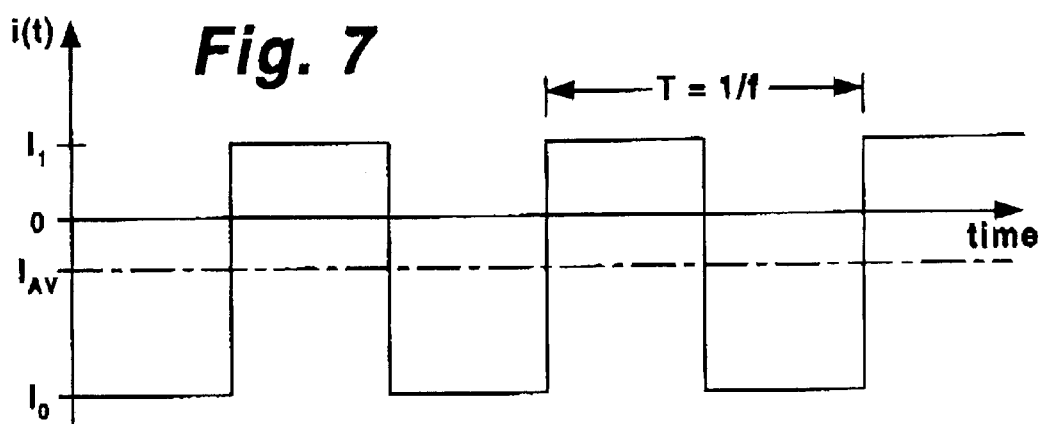
FIG. 7 is a graph of battery current i(t) as a function of time for particular values of $I_0$ and $I_1$ in accordance with one aspect of the present invention.

FIG. 7 is a graph of battery current i(t) (assumed positive in the charging direction) as a function of time under the assumption that a timing-signal logic "zero" results in $I_0 < 0$, and a timing-signal logic "one" results in $I_1 > 0$. One sees from FIG. 7 that the peak-to-peak current amplitude of i(t) is given by $$I_{p-p} = |I_1 - I_0| = |V_1 - V_0|/R_F \text{ amps} \tag{1}$$

and the average or dc value of i(t) is $$I_{AV} = \frac{I_1 + I_0}{2} = -\left(\frac{V_1 + V_0}{2R_F}\right) \text{ amps} \tag{2}$$

In FIG. 7, $I_{AV} < 0$ indicating a net "discharging" current. In general, however, the average current can be either positive, negative, or zero; corresponding to a net "charging" current, a net "discharging" current, or zero net (dc) current. Accordingly, the time-varying current through the cell/battery is a symmetrical square wave having frequency, amplitude, average value, and average flow direction completely under the programmed control of microprocessor/controller 20. This completes the disclosure of my invention.

Although the invention has been described with reference to preferred embodiments, workers skilled in the art will recognize that changes can be made in form and detail without departing from the true spirit and scope of the invention. For example, auxiliary dc supply 220 could encompass any source of dc power including a self-contained electrochemical battery, a solar battery, or a rectifier-type power supply connected to the ac mains. Transistors Q1 and Q2 could comprise complementary bipolar junction transistors as well as complementary mosfet transistors. Other periodic waveforms, such as sine waves and triangle waves, could be generated in place of square waves. Any immittance component or combination thereof could be measured including impedance magnitude, admittance magnitude, phase angle, resistance, reactance, conductance, or susceptance. These, and other, variations will be apparent to one skilled in the art and are intended to fall within the scope of the appended claims.

Although the present invention has been described with reference to preferred embodiments, workers skilled in the art will recognize that changes may be made in form and detail without departing from the spirit and scope of the invention.

What is claimed is:

1. Apparatus for passing a periodic time-varying current at a particular measurement frequency through an electrochemical cell or battery comprising:
    an auxiliary dc power supply contacting a first terminal of said cell or battery and adapted to inject current into said cell or battery in the charging direction;
    a resistor contacting a second terminal of said cell or battery and adapted to conduct current through said cell or battery in either the charging direction or the discharging direction;
    a pair of complementary transistors connected in series across said auxiliary dc power supply and arranged to conduct current through said resistor in either the charging direction or the discharging direction;
    an operational amplifier arranged to sense the voltage across said resistor at an inverting input and to control conduction of said complementary transistors; and,
    a signal source delivering a periodic control signal at said measurement frequency to a noninverting input of said operational amplifier.

2. Apparatus as in claim 1 wherein said periodic control signal is a square wave signal.

3. Apparatus as in claim 1 wherein said periodic control signal is a sine wave signal.

4. Apparatus as in claim 1 wherein said complementary transistors are complementary mosfet transistors.

5. Apparatus as in claim 1 wherein said complementary transistors are complimentary bipolar junction transistors.

6. Apparatus as in claim 1 wherein said auxiliary dc power supply is an electrochemical cell or battery.

7. Apparatus as in claim 1 wherein said auxiliary dc power supply is a rectifier-type power supply connected to ac mains.

8. Apparatus as in claim 2 wherein said square wave signal comprises an output voltage of a multiplexer toggled between first and second dc voltage levels by a timing signal at said measurement frequency.

9. Apparatus as in claim 8 wherein said first and second dc voltage levels result from analog to digital conversion of first and second latched digital words.

10. Apparatus as in claim 8 wherein said timing signal is outputted by a microprocessor or microcontroller.

11. Apparatus as in claim 9 wherein said first and second latched digital words are outputted by a microprocessor or microcontroller.

12. Apparatus for exciting an electrochemical cell or battery with a time-varying current comprising:
- an auxiliary dc power source having terminal voltage larger than the terminal voltage of said electrochemical cell or battery;
- a pair of transistors connected to said cell or battery and to said auxiliary dc power source, the first one of said transistors arranged to pass current through said cell or battery in the discharging direction, the second one of said transistors arranged to pass current from said auxiliary dc power source through said electrochemical cell or battery in the charging direction;
- a resistor arranged to conduct current through said cell or battery in either said discharging direction or in said charging direction;
- an operational amplifier arranged to control conduction of said pair of transistors, an inverting input of said operational amplifier connected to sense the voltage developed across said resistor, a non-inverting input of said operational amplifier connected to accept a time-varying control signal; and,
- a signal source arranged to deliver said time-varying control signal to said non-inverting input of said operational amplifier.

13. Apparatus as in claim 12 wherein said signal source comprises a square wave signal source.

14. Apparatus as in claim 12 wherein said signal source comprises a sine wave signal source.

15. Apparatus as in claim 12 wherein said pair of transistors comprises a pair of mosfet transistors.

16. Apparatus as in claim 12 wherein said pair of transistors comprises a pair of bipolar junction transistors.

17. Apparatus as in claim 12 wherein said auxiliary dc power source comprises an electrochemical cell or battery.

18. Apparatus as in claim 12 wherein said auxiliary dc power source comprises a rectifier-type power source connected to ac mains.

19. Apparatus as in claim 13 said square wave signal comprises the output voltage of a multiplexer toggled between first and second dc voltage levels by a timing signal.

20. Apparatus as in claim 19 wherein said first and second do voltage levels result from analog to digital conversion of first and second latched digital words.

21. Apparatus as in claim 19 wherein said timing signal is outputted by a microprocessor or microcontroller.

22. Apparatus as in claim 20 wherein said first and second latched digital words are outputted by a microprocessor or microcontroller.

23. A method for exciting an electrochemical cell or battery with a square wave current at a particular frequency comprising:
- latching a first digital word representative of a first level of said square wave current;
- latching a second digital word representative of a second level of said square wave current;
- converting said first and second digital words into first and second analog voltages;
- alternately selecting each of said first and second analog voltages in synchronism with a timing signal at said particular frequency; and,
- passing a current through said electrochemical cell or battery in accordance with the said analog voltage selected.

24. A method as in claim 23 wherein said first and second digital words and said timing signal are generated by a microprocessor or microcontroller.

25. A method as in claim 23 wherein the average value of said square wave current is positive.

26. A method as in claim 23 wherein the average value of said square wave current is negative.

27. A method as in wherein the average value of said square wave current is zero.

28. A method as in claim 23 wherein said current through said electrochemical cell or battery is proportional to the said analog voltage selected.

29. A method for passing a square wave current having zero average value through an electrochemical cell or battery during measurement of at least one component of complex immittance comprising the steps of:
- a. passing a constant current of particular amplitude through said electrochemical cell or battery in the charging direction for a fixed interval of time;
- b. passing a constant current of the same said particular amplitude through said electrochemical cell or battery in the discharging direction for the same said fixed interval of time; and,
- c. alternately repeating steps a and b.

30. A method for passing a square wave current comprising a net charging current through an electrochemical cell or battery during measurement of at least one component of complex immittance comprising the steps of:
- a. passing a constant current of particular amplitude through said electrochemical cell or battery in the charging direction for a fixed interval of time;
- b. passing a constant current of amplitude smaller than said particular amplitude through said electrochemical cell or battery in the discharging direction for the same said fixed interval of time; and,
- c. alternately repeating steps a and b.

31. A method for passing a square wave current comprising a net discharging current through an electrochemical cell or battery during measurement of at least one component of complex immittance comprising the steps of:
- a. passing a constant current of particular amplitude through said electrochemical cell or battery in the charging direction for a fixed interval of time;
- b. passing a constant current of amplitude larger than said particular amplitude through said electrochemical cell or battery in the discharging direction for the same said fixed interval of time; and, c. alternately repeating steps a and b.

32. Apparatus for exciting an electrochemical cell or battery with a square wave current at a particular frequency adapted to perform the method according to claim 23.

33. Apparatus for passing a square wave current having zero average value through an electrochemical cell or battery adapted to perform the method according to claim 29.

34. Apparatus for passing a square wave current comprising a net charging current through an electrochemical cell or battery adapted to perform the method according to claim 29.

35. Apparatus for passing a square wave current comprising a net discharging current through an electrochemical cell or battery adapted to perform the method according to claim 31.

* * * * *

UNITED STATES PATENT AND TRADEMARK OFFICE
CERTIFICATE OF CORRECTION

PATENT NO. : 6,621,272 B2
DATED : September 16, 2003
INVENTOR(S) : Keith S. Champlin It is certified that error appears in the above-identified patent and that said Letters Patent is hereby corrected as shown below:

Column 5,
Line 56, after "13" insert -- wherein --.
Line 61, delete "do" and insert -- dc --.

Column 6,
Line 26, after "in" insert -- claim 23 --.

Signed and Sealed this

Twenty-first Day of September, 2004

JON W. DUDAS
*Director of the United States Patent and Trademark Office*

UNITED STATES PATENT AND TRADEMARK OFFICE
CERTIFICATE OF CORRECTION

PATENT NO.    : 6,621,272 B2
DATED         : September 16, 2003
INVENTOR(S)   : Keith S. Champlin It is certified that error appears in the above-identified patent and that said Letters Patent is hereby corrected as shown below:

Column 8,
Line 4, delete "29" and insert -- 30 --.

Signed and Sealed this

Twenty-eighth Day of December, 2004

JON W. DUDAS
*Director of the United States Patent and Trademark Office*